(12) United States Patent
Beers et al.

(10) Patent No.: US 9,970,098 B2
(45) Date of Patent: May 15, 2018

(54) MOVABLE EVAPORATION SOURCE

(71) Applicant: United Technologies Corporation, Hartford, CT (US)

(72) Inventors: Russell A. Beers, Manchester, CT (US); Joseph A. DePalma, Feeding Hills, MA (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 22 days.

(21) Appl. No.: 14/559,033

(22) Filed: Dec. 3, 2014

(65) Prior Publication Data
US 2015/0167149 A1 Jun. 18, 2015

Related U.S. Application Data

(60) Provisional application No. 61/916,596, filed on Dec. 16, 2013.

(51) Int. Cl.
*C23C 14/32* (2006.01)
*C23C 14/22* (2006.01)

(52) U.S. Cl.
CPC .......... *C23C 14/325* (2013.01); *C23C 14/225* (2013.01)

(58) Field of Classification Search
CPC ............................ C23C 14/325; C23C 14/225
USPC ...................................................... 118/723 R
See application file for complete search history.

(56) References Cited

U.S. PATENT DOCUMENTS

| | | | | |
|---|---|---|---|---|
| 2,543,436 A * | 2/1951 | Chappen | ............. | B05B 13/0405 114/221 R |
| 2,611,069 A * | 9/1952 | Frazier | ................... | A47J 31/047 200/51.09 |
| 3,155,055 A * | 11/1964 | Nishkian | ............... | A21C 11/006 425/291 |
| 3,171,131 A * | 3/1965 | De Caro | ................. | B25C 1/105 227/10 |
| 3,240,652 A * | 3/1966 | La Mers | ................. | B65C 1/021 156/361 |
| 3,782,708 A * | 1/1974 | Dulude | ..................... | F16F 3/04 192/89.26 |
| 3,992,606 A * | 11/1976 | Arutt | ....................... | B29C 65/04 156/515 |
| 4,715,921 A * | 12/1987 | Maher | ............... | H01L 21/67069 156/345.32 |
| 4,917,786 A * | 4/1990 | Ehrich | ................... | C23C 14/046 118/723 EB |
| 5,084,956 A * | 2/1992 | Saito | .................... | H01H 71/345 228/193 |
| 5,104,509 A * | 4/1992 | Buck | ..................... | C23C 14/325 204/192.38 |
| 5,206,996 A * | 5/1993 | McDaniel | .............. | B26D 3/169 30/101 |

(Continued)

*Primary Examiner* — Keath T Chen
(74) *Attorney, Agent, or Firm* — Snell & Wilmer LLP

(57) ABSTRACT

A moveable evaporation source system may have an insulator disposed above a cathode support member, and a cathode support member disposed beneath the insulator and exerting an upward force on the insulator so that the upward force exerted by the cathode support member urges the insulator toward a down force source. A cathode may be placed between the insulator and the down force source and translated so that material liberated from the cathode may strike different portions of a workpiece as the cathode is translated.

13 Claims, 3 Drawing Sheets

(56) References Cited

U.S. PATENT DOCUMENTS

| | | | | |
|---|---|---|---|---|
| 5,269,896 A * | 12/1993 | Munemasa | ........ | H01J 37/32055 |
| | | | | 204/192.38 |
| 5,895,559 A * | 4/1999 | Christy | ................ | C23C 14/325 |
| | | | | 204/192.38 |
| 7,614,963 B2 * | 11/2009 | Cheng | .................... | A63B 53/10 |
| | | | | 473/318 |
| 2001/0010172 A1 * | 8/2001 | Kawasaki | ........... | B29C 45/4005 |
| | | | | 73/384 |
| 2003/0146211 A1 * | 8/2003 | Kang | ................. | H05B 6/6411 |
| | | | | 219/754 |
| 2009/0151870 A1 * | 6/2009 | Urakawa | ........... | H01J 37/32642 |
| | | | | 156/345.1 |
| 2013/0247826 A1 * | 9/2013 | Tzu | ......................... | C23C 16/46 |
| | | | | 118/725 |

\* cited by examiner

MOVABLE EVAPORATION SOURCE

CROSS-REFERENCE TO RELATED APPLICATIONS

This application is a nonprovisional of, and claims priority to, and the benefit of U.S. Provisional Application No. 61/916,596, entitled "MOVABLE EVAPORATION SOURCE," filed on Dec. 16, 2013, which is hereby incorporated by reference in its entirety.

FIELD

The present disclosure relates to physical vapor deposition systems, and more specifically, to cathodic arc physical vapor deposition systems.

BACKGROUND

Physical vapor deposition involves providing a source material and a workpiece to be coated in a deposition chamber. The source material is converted into vapor by an energy input, such as heating by resistive, inductive, or electron beam means.

Cathodic arc vapor deposition involves placement of a source material and a workpiece to be coated in a deposition chamber. The negative lead of a direct current (DC) power supply is attached to the source material (hereinafter referred to as the "cathode") and the positive lead is attached to an anodic member. In many cases, the positive lead is attached to the deposition chamber, thereby making the chamber the anode. An arc-initiating trigger, at or near the same potential as the anode, contacts and moves away from the cathode. When the trigger is in close proximity to the cathode, the difference in potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

Current cathodic arc systems use cathodes with a fixed location within a coating chamber. Consequently, evaporation occurs at a generally fixed location within the constraints of the cathode geometry. As a result, deposition occurs non-uniformly at different places in the chamber, so that a coating deposited on a workpiece may have a non-uniform thickness depending on the fixed orientation of the cathode.

SUMMARY

In various embodiments, a moveable evaporation source system is provided having an insulator disposed above a cathode support member, and a cathode support member disposed beneath the insulator and exerting an upward force on the insulator and cathode, wherein the upward force exerted by the cathode support member urges the insulator toward a down force source.

In various embodiments, a moveable evaporation source system is provided having an insulator disposed above a cathode support member, and a cathode support member disposed beneath the insulator and exerting an upward force on the insulator and cathode, wherein the upward force exerted by the cathode support member urges the insulator toward a down force source, and wherein the cathode support member has a lower portion, an upper portion retained mechanical communication with the lower portion and telescoping within the lower portion, and a force provider configured to impart an upward force from the lower portion to the upper portion.

In various embodiments, a method of depositing a liberated material on a workpiece includes providing a down force from a down force source on a cathode whereby the cathode is located at a first position, initiating an arc whereby material is liberated from the cathode, providing a balancing force against the down force wherein the balancing force is provided by a cathode support member comprising a force provider and wherein the balancing force is in response to the down force, depositing the liberated material on a first deposition site on a workpiece wherein the liberated material follows a look angle and strikes the workpiece, varying the down force whereby the cathode is translated to a second position, and depositing the liberated material on a second deposition site on the workpiece wherein the liberated material follows the look angle and strikes the workpiece at the second deposition site.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As used herein, phrases such as "make contact with," "coupled to," "touch," "interface with" and "engage" may be used interchangeably.

As used herein, "beneath" means disposed at a position along the Y axis illustrated in the figures having a smaller positive value, or a greater negative value with respect to the origin of the axes system than the component that said item is located "beneath." For example, if a first item is located beneath a second item, the first item is disposed at a position along the Y axis illustrated in the figures having a smaller positive value, or a greater negative value with respect to the origin of the axes system than the second item. Moreover, as used herein, "upward" means extending in a positive direction along the Y axis illustrated in the figures.

As used herein, "above" means disposed at a position along the Y axis illustrated in the figures having a greater positive value, or a smaller negative value with respect to the origin of the axes system than the component that said item is located "above." For example, if a first item is located above a second item, the first item is disposed at a position along the Y axis illustrated in the figures having a greater positive value, or a smaller negative value with respect to the origin of the axes system than the second item.

Figure 1:
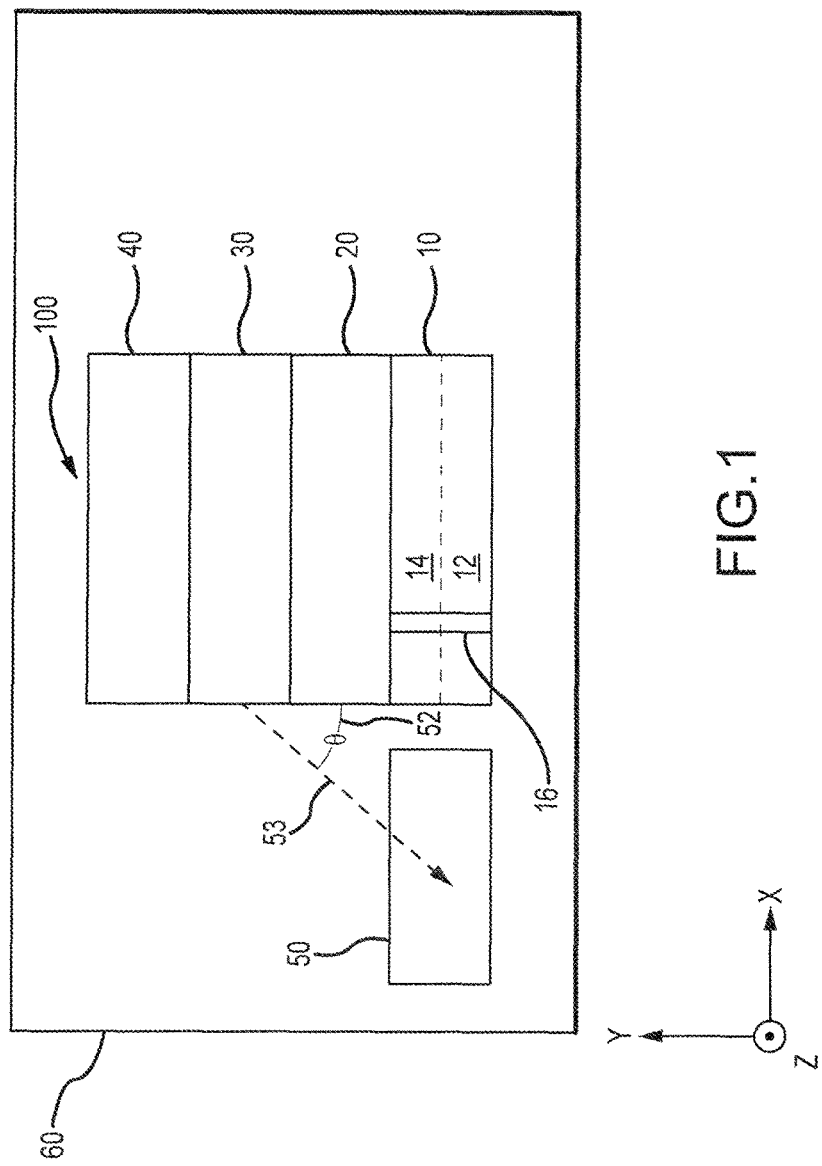
FIG. 1 illustrates functional relationships of various components of a cathodic arc physical vapor deposition system in accordance with various embodiments.

In various embodiments, the present disclosure provides a cathodic arc physical vapor deposition system comprising a moveable evaporation source system. In various embodiments, a moveable evaporation source system comprises a cathode support member, an insulator, and a down force source. A moveable evaporation source system may further comprise a cathode. For example, with reference to FIG. 1, a moveable evaporation source system 100 may comprise a cathode support member 10, an insulator 20, a cathode 30, and a down force source 40. FIG. 1 also illustrates an x, y, and z axes for descriptive purposes. In various embodiments, a cathode support member 10 provides mechanical support for an insulator 20 and cathode 30, and insulator 20 provides electrical isolation between cathode 30 and cathode support member 10. Moreover, a down force source 40 may engage in mechanical communication with cathode 30, whereby a force may be exerted on cathode 30 in the negative Y direction. Moreover, cathode support member 10 may comprise an upper portion 14 and a lower portion 12. In various embodiments, the upper portion 14 telescopes within lower portion 12. Moreover, a force provider 16 may be disposed within upper portion 14 and lower portion 12. Force provider 16 may exert an upward force from the lower portion 12 to the upper portion 14, for example, in the positive Y direction. In various embodiments, force provider 16 comprises a spring. In this manner, cathode 30 may be translated along the Y-axis by varying the force exerted by down force source 40.

Figure 2:
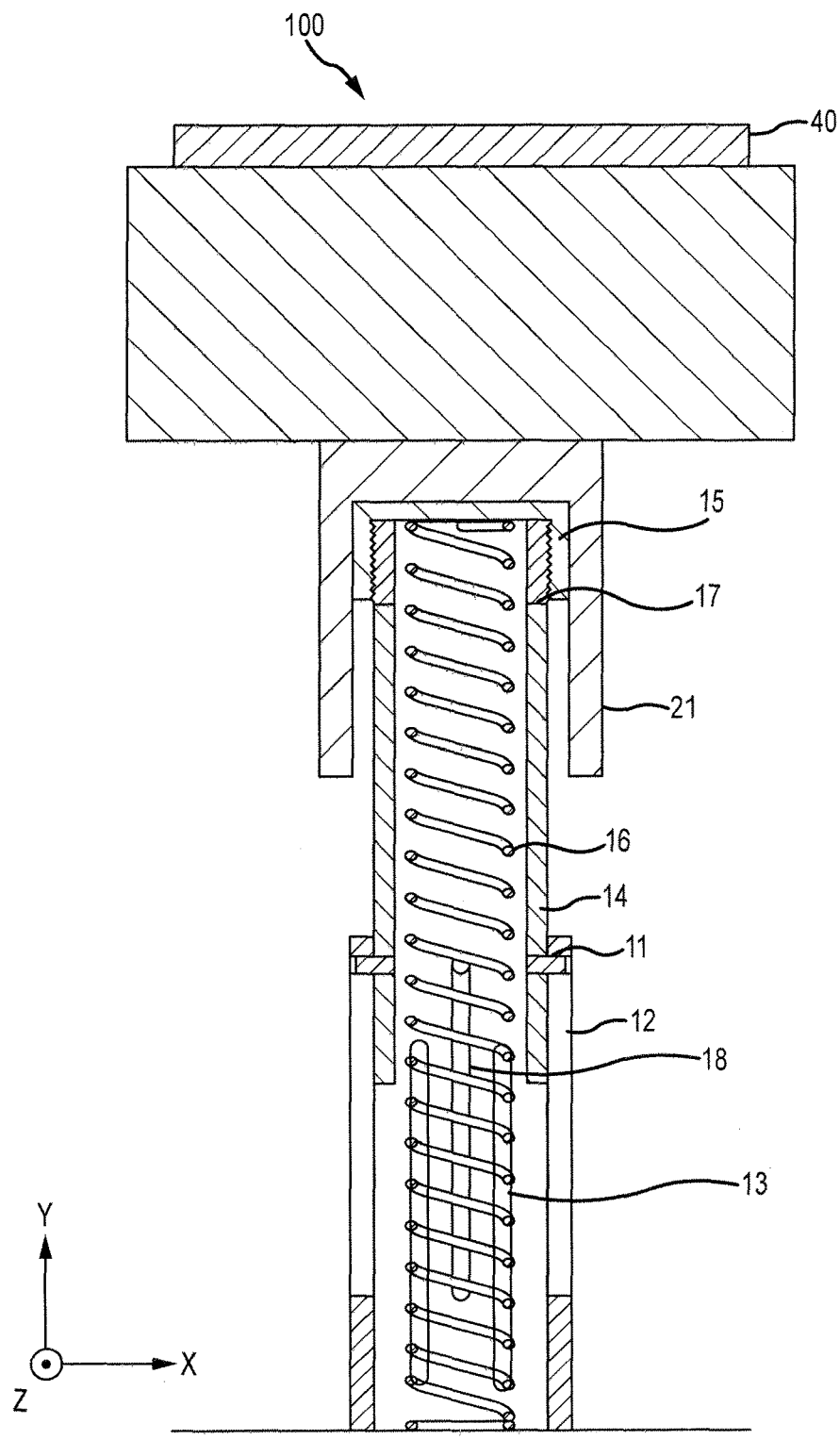
FIG. 2 illustrates a cut away view of various aspects of a cathodic arc physical vapor deposition system in accordance with various embodiments.

With reference to FIG. 1 and FIG. 2, in various embodiments, a cathode support member 10 may comprise a lower portion 12, an upper portion 14, and a force provider 16. FIG. 2 also illustrates an x, y, and z axes for descriptive purposes. In various embodiments lower portion 12 may comprise a cylindrical tube and upper portion 14 may comprise a cylindrical tube configured to telescope within lower portion 12. In this manner, upper portion 14 and lower portion 12 may telescope along the Y-axis. Furthermore, in various embodiments, force provider 16 may be disposed within upper portion 14 and lower portion 12. Force provider 16 may be configured to exert a force in the positive Y direction.

In various embodiments, force provider 16 comprises a spring. The spring may be comprised of an austenitic nickel-chromium-based alloy such as Inconel® which is available from Special Metals Corporation of New Hartford, N.Y., USA, or any other high-temperature tolerant material. Moreover, force provider 16 may be selected to compress to a desired resting length upon the exertion of 100 pounds (~444 Newtons) of compression force and to compress fully upon the exertion of 500 pounds (~2224 Newtons) of compression force, although a spring having any properties selected to provide a desired stiffness and compression length.

With reference to FIG. 2, in various embodiments, upper portion 14 may further comprise pins 11 and lower portion 12 may further comprise slots 18. In various embodiments, pins 11 fit within slots 18. In various embodiments, slots 18 are configured to regulate the maximum and minimum length that cathode support member 10 can achieve via telescoping along the Y-axis. In various embodiments, lower portion 12 may comprise 4 slots 18 and upper portion 14 may comprise 4 pins 11. Alternatively, lower portion 12 may comprise more slots than there are pins in upper portion 14, so that upper portion 14 may be disposed within lower portion 12 at multiple orientations. For example, lower portion 12 may comprise two sets of slots wherein one set of slots 18 has a different length than the other set of slots 13, for example, to permit the maximum and/or minimum length that cathode support member 10 can achieve by telescoping along the Y-axis to be changed by changing the set of slots in which pins 11 are disposed.

Figure 3:
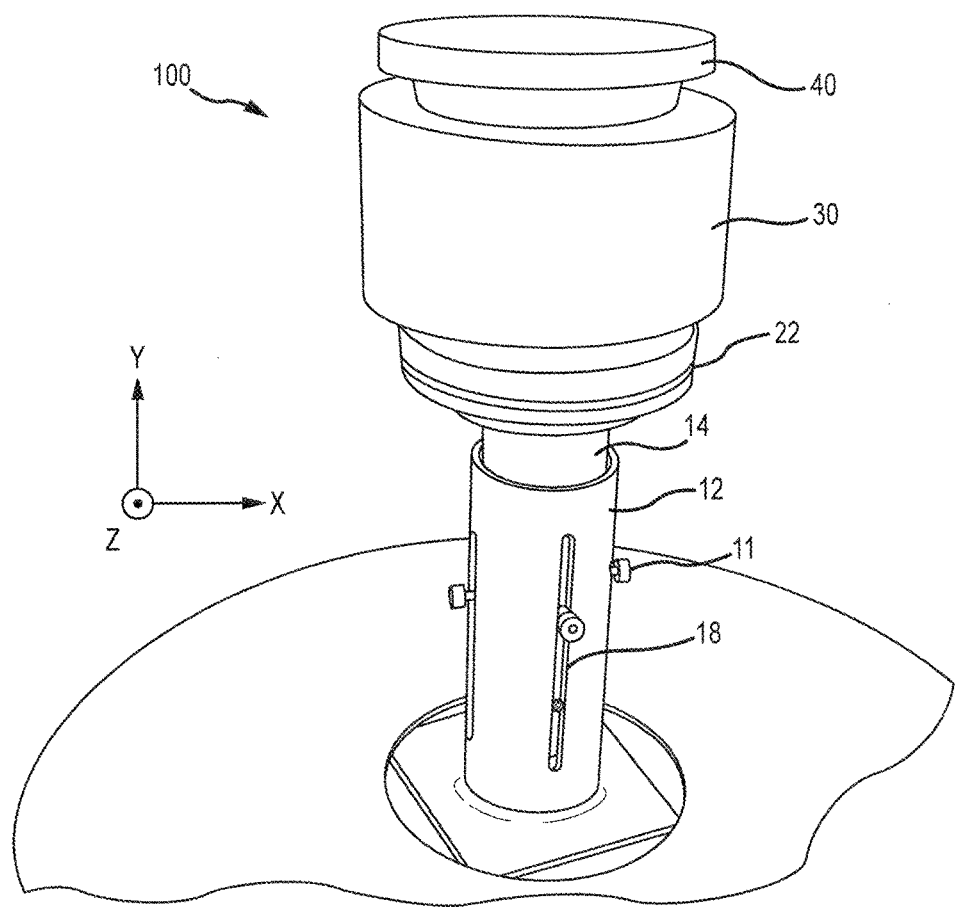
FIG. 3 illustrates various aspects of a cathodic arc physical vapor deposition system in accordance with various embodiments.

In various embodiments, upper portion 14 of cathode support member 10 may mechanically interface with an insulator 20. In various embodiments, insulator 20 may comprise different configurations, for example a cup insulator 21 (FIG. 2), or a platter insulator 22 (FIG. 3). For example, FIG. 2 shows insulator 20 as an insulator cup 21, whereas FIG. 3 shows insulator 20 as insulator platter 22. In this regard, there may be various embodiments with variously configured insulators 20.

With continuing reference to FIG. 2, in various embodiments, upper portion 14 comprises a threaded portion 17 configured to receive corresponding threads from insulator 20 (depicted as a cup insulator 21), whereby the insulator is mounted to upper portion 14. However, upper portion 14 of cathode support member 10 may comprise any mounting apparatus or configuration adapted to interface with the insulator.

In various embodiments, the insulator may comprise a mounting insert. For example, with reference to FIG. 2, a cup insulator 21 comprises a mounting insert 15. Mounting insert 15 may be a threaded insert configured to interface with threaded portion 17 of upper portion 14 of cathode support member 10. In various embodiments, however, the insulator may not comprise a mounting insert 15 and may have integrated threads configured to interface with threaded portion 17 of upper portion 14 of cathode support member 10. However, the insulator may comprise any apparatus or configuration adapted to interface with upper portion 14 of cathode support member 10.

With reference to FIG. 1 and FIG. 2, in various embodiments, insulator 20 comprises a cup insulator 21. For example, insulator 20 may comprise a portion extending in a substantially planar manner in the X-Z plane. In this manner, cup insulator 21 may comprise a portion providing electrical isolation between cathode 30 and cathode support member 10. Moreover, cup insulator 21 may comprise a portion extending in a substantially cylindrical manner extending annularly about the Y axis, whereby this portion covers a part of upper portion 14 and optionally, lower portion 12. In this manner, cup insulator 21 may provide additional electrical isolation between cathode 30 and cathode support member 10 whereby arcing may be ameliorated. However, cup insulator 21 may comprise any shape or design configured to increase the minimum arc length between cathode 30 and upper portion 14 sufficiently to ameliorate unwanted arcing between cathode 30 and upper portion 14 of cathode support member 10 (FIG. 1) for a given operating environment.

With reference to FIG. 1 and FIG. 3, in various embodiments, insulator 20 comprises a platter insulator 22. FIG. 3 also illustrates an x, y, and z axes for descriptive purposes. For example, platter insulator 22 may comprise a portion extending substantially in a substantially planar manner in the X-Z plane. In this manner, platter insulator 22 may comprise a portion providing electrical isolation between cathode 30 and upper portion 14 of cathode support member 10 (FIG. 1). However, platter insulator 20 may comprise any shape or design configured to increase the minimum arc length between cathode 30 and upper portion 14 sufficiently to ameliorate unwanted arcing between cathode 30 and upper portion 14 of cathode support member 10 (FIG. 1) for a given operating environment.

In various embodiments, insulator 20 may comprise a ceramic material and/or a glass material. However, insulator 20 may comprise any material adapted to provide electrical isolation and mechanical resiliency in a given operating environment. For example, in various embodiments, ceramic material is configured to withstand temperatures of 1500 degrees Fahrenheit to 1800 degrees Fahrenheit (~815 degrees Celsius to ~983 degrees Celsius) and at least 500 pounds to 1500 pounds (~2224 to ~6673 Newtons) of force in the Y-axis direction.

In various embodiments, a cathode may comprise a substantially cylindrical body, although a cathode may comprise a body having any shape. In various embodiments, a cathode may comprise an electrically conductive material. As discussed herein, an arc may travel from the cathode to an anodic surface. In this manner, the material at the cathode spot may be caused to vaporize, thereby liberating atoms, molecules, ions, electrons, and/or particles from the cathode so that they strike a workpiece and form a coating of the cathode material on the workpiece. For example, with reference to FIG. 1, liberated material 53 travels from cathode 30 along a path defined by a look angle 52 and deposits on workpiece 50. By translating the cathode 30 along the Y axis, the point at which liberated material 53 following look angle 52 strikes workpiece 50 may be translated. As used herein, "look angle" means a path from a cathode to a workpiece wherein the density of liberated material 53 is greatest. In various embodiments, look angle 52 may comprise a conical geometric surface radially extending from a cylindrical cathode to an underlying workpiece 50.

In various embodiments, a down force source 40 may provide a variable force in the negative Y direction on cathode 30. In various embodiments, a down force source 40 may comprise a hydraulic ram. In other embodiments, a down force source 40 may comprise a pneumatic ram; however, a down force source 40 may comprise any device adapted to provide a variable force in the negative Y direction on cathode 30. In this manner, the cathode 30 may be translated along the Y-axis, so that the material liberated from the cathode 30 may strike different portions of a workpiece 50 as the cathode 30 is translated. In this manner, the uniformity of the coating of the cathode material deposited on the workpiece 50 may be controlled.

Now, having described various components of moveable evaporation source systems, a moveable evaporation source system 100 may be used according to various methods. For example, a down force source 40 may provide a variable force in the negative Y direction on a cathode 30, whereby cathode 30 is located at a desired position. A negative electric potential may be conducted into a cathode 30 and an arc may be initiated between cathode 30 and an anodic member, for example, with reference to FIG. 1, anodic chamber 60, whereby liberated material 53 travels from cathode 30 along a path defined by a look angle 52 and deposits on a workpiece 50. The variable force provided by down force source 40 may be varied, causing the cathode 30 to translate in the Y direction. A variable balancing force may be provided by cathode support member 10 wherein a force provider 16 exerts a force on upper portion 14, thereby facilitating the movement of upper portion 14 whereby cathode 30 is supported. Moreover, slots 18 may interface with pins 11 whereby the upper and lower bounds of the translation of cathode 30 may be established. In this manner, the cathode 30 may be translated along the Y axis wherein the cathode support member 10 defines the path of translation of cathode 30 and provides the balancing force necessary to facilitate cathode 30 to follow the movement of down force source 40. In this manner, the point at which liberated material 53 following look angle 52 strikes workpiece 50 may be translated.

Now, having described various components of moveable evaporation source systems, various components may be manufactured from various materials. In various embodiments, a cathode support member may comprise steel. However, in further embodiments, a cathode support member may comprise other metals, such as titanium, tungsten, aluminum, or stainless steel, though it may further comprise numerous other materials configured to provide mechanical resiliency. In various embodiments, various portions of cathode support members as disclosed herein are made of different materials or combinations of materials, and/or may comprise coatings.

In various embodiments, an insulator may comprise ceramic such as silicon carbide, silicone boride, porcelain, and others. However, in further embodiments, an insulator may comprise other materials, such as dense alumina, glass, composites, or plastics, though it may further comprise numerous other materials configured to provide electrical isolation and mechanical resiliency. In various embodiments, various portions of an insulator as disclosed herein are made of different materials or combinations of materials, and/or may comprise coatings.

In various embodiments, a cathode may comprise a conductive material. For example, in various embodiments, a cathode may comprise metals, alloys, intermetallics, and/or semiconductor materials, though it may further comprise numerous other materials configured to provide a coating having desired electrical, magnetic, chemical, mechanical, or biological properties to a workpiece. For example, a cathode may comprise titanium, aluminum, or chromium, or a combination of conductive materials. Moreover, a cathode may comprise semiconducting material, or superconducting material, or carbon materials, or any other desired material. A cathode may comprise a material which interacts with surrounding gasses, for example, nitrogen, to provide a coating to a workpiece comprising compounds, such as nitrides, for example, titanium nitride or aluminum titanium nitride. In various embodiments, various portions of a cathode as disclosed herein are made of different materials or combinations of materials, and/or may comprise coatings.

In various embodiments, moveable evaporation source systems may comprise multiple materials, or any material configuration suitable to enhance or reinforce the resiliency and/or support of the system when subjected to wear in an operating environment or to satisfy other desired electromagnetic, chemical, physical, or biological properties such as heat capacity, thermal dissipation, and footprint constraints, among others.

In various embodiments, the present disclosure provides a moveable evaporation source system with improved cathode positioning functionality and an ability to more uniformly deposit material on a workpiece. Moreover, the moveable evaporation source system provides for this functionality without requiring extensive modifications to the surrounding components of the moveable evaporation source system, for example, without requiring additional penetrations of the anodic chamber.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A moveable evaporation source system for vapor deposition of material on a workpiece comprising:
   a down force source configured to exert a variable force along an axis;
   a chamber wall configured to function as an anode;
   a cathode positioned between the down force source and a cathode support member, the cathode configured to translate along the axis in response to the variable force, the cathode having a first surface perpendicular to the axis, a second surface opposite the first surface and an evaporation surface between the first surface and the second surface and, the evaporation surface being parallel to the axis, wherein a liberated material travels from the evaporation surface along a path defined by a look angle and deposits at a top surface of a work piece, the top surface being parallel to the first and second surface, wherein the workpiece is fixed between the cathode and the anode, wherein the evaporation surface is above the top surface of the workpiece; and
   a cathode support member configured to exert an opposing force along the axis that opposes the variable force.

2. The moveable evaporation source system according to claim 1, wherein the cathode support member comprises:
   a lower portion;
   an upper portion movable relative to the lower portion; and
   a force provider configured to urge the lower portion and the upper portion apart.

3. The moveable evaporation source system according to claim 2, wherein the force provider is a spring disposed within the lower portion and the upper portion.

4. The moveable evaporation source system according to claim 2, wherein the lower portion comprises slots and the upper portion comprises pins wherein the pins are disposed within the slots.

5. The system of claim 1, wherein the cathode support member is cylindrical.

6. The moveable evaporation source system according to claim 1, further comprising an insulator configured to be disposed between the cathode support member and the cathode.

7. The moveable evaporation source system according to claim 6, wherein the insulator comprises a cup insulator.

8. The moveable evaporation source system according to claim 6, wherein the insulator comprises a platter insulator.

9. The moveable evaporation source system according to claim 6, wherein the insulator comprises a mounting insert comprising threads and the upper portion comprises a threaded portion whereby the upper portion is configured to mechanically interface with the insulator.

10. The moveable evaporation source system according to claim 6, wherein the upper portion mechanically interfaces with the insulator.

11. The moveable evaporation source system according to claim 6, wherein the upper portion of the cathode support member mechanically engages with the insulator.

12. The moveable evaporation source system according to claim 6, wherein the insulator comprises a ceramic material.

13. The moveable evaporation source system according to claim 6, wherein the insulator comprises a glass material.

* * * * *